(12) United States Patent
Quartiroli et al.

(10) Patent No.: US 12,212,648 B2
(45) Date of Patent: *Jan. 28, 2025

(54) SENSOR DEVICE AND RELATED METHOD AND SYSTEM

(71) Applicant: STMICROELECTRONICS S.r.l., Agrate Brianza (IT)

(72) Inventors: Matteo Quartiroli, Certosa di Pavia (IT); Paolo Rosingana, Savigliano (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/453,018

(22) Filed: Aug. 21, 2023

(65) Prior Publication Data

US 2023/0396407 A1  Dec. 7, 2023

Related U.S. Application Data

(63) Continuation of application No. 17/707,423, filed on Mar. 29, 2022, now Pat. No. 11,784,784.

(30) Foreign Application Priority Data

Mar. 31, 2021   (IT) .................. 102021000008045

(51) Int. Cl.
*H04B 7/10* (2017.01)
*H04L 1/02* (2006.01)
*H04L 7/00* (2006.01)

(52) U.S. Cl.
CPC ................... *H04L 7/0079* (2013.01)

(58) Field of Classification Search
CPC ........ H04L 7/0079; G01D 21/00; G01S 13/87
USPC ............... 375/347, 260, 346, 349, 267, 340
See application file for complete search history.

(56) References Cited

U.S. PATENT DOCUMENTS

| | | | |
|---|---|---|---|
| 8,050,639 B2 | 11/2011 | Nakatani et al. | |
| 10,216,670 B2 | 2/2019 | Scozzola | |
| 10,509,104 B1* | 12/2019 | Dato | ................. G01S 13/87 |
| 11,784,784 B2* | 10/2023 | Quartiroli | .............. G01D 21/00 |
| | | | 375/375 |
| 2015/0185054 A1 | 7/2015 | Hesch et al. | |
| 2016/0169675 A1 | 6/2016 | Shindo | |
| 2019/0074958 A1 | 3/2019 | Liao et al. | |

\* cited by examiner

*Primary Examiner* — Phuong Phu
(74) *Attorney, Agent, or Firm* — Seed IP Law Group LLP

(57) ABSTRACT

A sensor includes detection circuitry and control circuitry coupled to the detection circuitry. The detection circuitry generates a detection signal indicative of a detected physical quantity. The control circuitry, in operation receives the detection signal and a frequency-indication signal, and generates a trigger signal based on the frequency-indication signal and a set of local reference signals. The sensor generates a digital output signal and a locking signal based on the trigger signal and the detection signal. The generating the digital output signal includes outputting a sample of the digital output signal based on the trigger signal. The locking signal is temporally aligned with the digital output signal.

20 Claims, 11 Drawing Sheets

SENSOR DEVICE AND RELATED METHOD AND SYSTEM

BACKGROUND

Technical Field

The present disclosure relates to a sensor, for example, a sensor obtained in MEMS (Micro-Electro-Mechanical Systems) technology.

Description of the Related Art

As is known, there is a widespread use, for example both in the field of consumer electronics and in the industrial and automotive sectors, of electronic apparatuses that incorporate a plurality of sensors each configured to detect one or more respective physical quantities useful for operation of the respective electronic apparatus.

For instance, the sensors may be accelerometers, gyroscopes, temperature sensors, pressure sensors, electrical-resistance sensors, mechanical-stress sensors, and strain gauges, etc.

It is also known to make such sensors with MEMS technology, which enables to obtain sensors having small dimensions, low energy consumption, and high detection accuracy.

MEMS sensors convert a physical quantity into a respective electrical signal, of an analog type, whose evolution in time is a function of the evolution in time of the detected physical quantity. Further, MEMS sensors are each configured to convert the respective analog signal into a corresponding (digital) discretized signal having a respective output sample rate, and supply the respective discretized signal to a control unit of the electronic apparatus.

The control unit of the electronic apparatus is configured to process the discretized signals received from the plurality of sensors.

It is desirable to ensure that the sensors send, to the electronic apparatus, in a mutually synchronized way, the respective discretized signal. Different approaches are adopted for this purpose.

In one approach, the analog signals generated by the sensors are first stored in a sample-and-hold circuit and then discretized by a single analog-to-digital converter.

In another approach, the sensors each comprise a respective analog-to-digital converter, the discretization function of which is controlled in parallel by a single trigger signal.

However, both of these approaches involve incorporating additional devices in the electronic apparatus and thus involve a high cost and a high energy consumption of the electronic apparatus. In addition, these approaches are not suited to applications where it is desirable to have a high output-data rate from the sensors.

In another approach, the control unit of the electronic apparatus is configured to receive specific information of configuration from the sensors, from which the control unit determines a series of synchronization instructions to be sent to the sensors. However, this approach requires high calculation resources by the control unit of the electronic apparatus, with consequent high energy consumption. Further, this approach also requires the use of a dedicated communication interface between the sensors and the control unit, with consequent reduction in versatility and simplicity of implementation of the electronic apparatus.

BRIEF SUMMARY

In an embodiment, a sensor includes detection circuitry and control circuitry coupled to the detection circuitry. The detection circuitry generates a detection signal indicative of a detected physical quantity. The control circuitry, in operation receives the detection signal and a frequency-indication signal, and generates a trigger signal based on the frequency-indication signal and a set of local reference signals. The sensor generates a digital output signal and a locking signal based on the trigger signal and the detection signal. The generating the digital output signal includes outputting a sample of the digital output signal based on the trigger signal. The locking signal is temporally aligned with the digital output signal.

In an embodiment, a system comprises: a plurality of sensors, each sensor including: detection circuitry, which, in operation, generates a detection signal indicative of a detected physical quantity; and processing circuitry coupled to the detection circuitry, wherein the processing circuitry, in operation: receives the detection signal; receives a frequency-indication signal; generates a trigger signal based on the frequency-indication signal and a set of local reference signals; generates a digital output signal and a locking signal based on the trigger signal and the detection signal, wherein the generating the digital output signal comprises outputting a sample of the digital output signal based on the trigger signal and the locking signal is temporally aligned with the digital output signal, wherein, the plurality of sensors includes a reference sensor and a slave sensor coupled to the reference sensor; the locking signal of the reference sensor is the received frequency-indication signal of the slave sensor.

In an embodiment, a method comprises: synchronizing samples of digital output signals of a plurality of sensors, the plurality of sensors including a reference sensor and a slave sensor, the synchronizing including: receiving, by the reference sensor, a first frequency-indication signal; generating, by the reference sensor, a first trigger signal as a function of the first frequency-indication signal and a first set of local reference signals; generating, by the reference sensor based on the first trigger signal, a sample of the digital output signal of the reference sensor and a first locking signal, the first locking signal being temporally aligned with the digital output signal of the reference sensor; receiving, by the slave sensor, the first locking signal; generating, by the slave sensor, a second trigger signal as a function of the first locking signal and a second set of local reference signals; and generating, by the slave sensor based on the second trigger signal, a sample of the digital output signal of the slave sensor and a second locking signal, the second locking signal being temporally aligned with the digital output signal of the slave sensor.

In an embodiment a non-transitory computer-readable medium's contents configure processing circuitry to synchronize samples of digital output signals of a plurality of sensors, the plurality of sensors including a reference sensor and a slave sensor, the synchronizing including: receiving, by the reference sensor, a first frequency-indication signal; generating, by the reference sensor, a first trigger signal as a function of the first frequency-indication signal and a first set of local reference signals; generating, by the reference sensor based on the first trigger signal, a sample of the digital output signal of the reference sensor and a first locking signal, the first locking signal being temporally aligned with the digital output signal of the reference sensor; receiving, by the slave sensor, the first locking signal; generating, by the slave sensor, a second trigger signal as a function of the first locking signal and a second set of local reference signals; and generating, by the slave sensor based on the second trigger signal, a sample of the digital output signal of the slave sensor and a second locking signal, the second locking signal being temporally aligned with the digital output signal of the slave sensor.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

Hereinafter, if not otherwise specified, reference is made to the frequency of a discretized (digital) signal to indicate the sample frequency thereof, the data rate at which the samples of the discretized signal are supplied at output from the respective block that has generated it.

DETAILED DESCRIPTION

Figure 1:
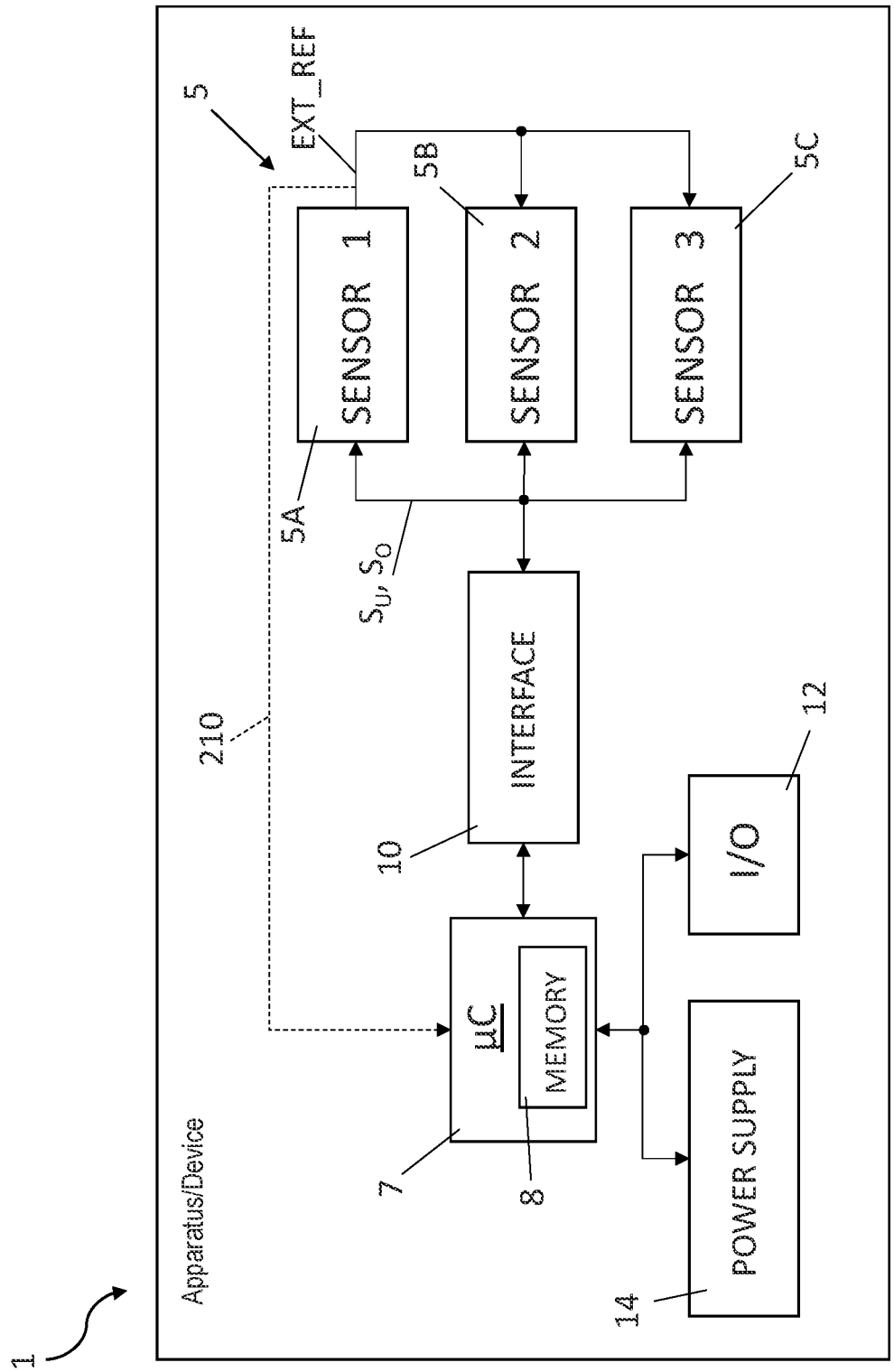
FIG. 1 shows a block diagram of an electronic apparatus comprising a plurality of sensors, according to an embodiment.

FIG. 1 is a schematic illustration of an electronic system or apparatus 1, for example a smartphone, a wearable device, a device for augmented or virtual reality, an apparatus for monitoring one or more physical quantities, for example for monitoring vibrations, an automotive control system, etc.

The electronic apparatus 1 comprises a plurality of sensors 5, a control unit or circuit 7 and an interface 10, which operatively mutually couples together the plurality of sensors 5 and the control unit 7.

The control unit 7 comprises a memory 8 and a processing unit or core and is configured to send instructions to the sensors 5, for example configuration instructions, and to receive measurement data or samples from the sensors 5 through the interface 10, which is, for example, a bus of a known type for transfer of electrical signals.

The electronic apparatus 1 further comprises input and output peripherals 12, for example a screen, in particular of a touchscreen type, one or more keys, etc., and a power-supply unit 14, for example a battery. The input and output peripherals 12 and the power-supply unit 14 are coupled to the control unit 7. The power-supply unit 14 may be configured also to supply a supply voltage to the sensors 5, through the interface 10.

The plurality of sensors 5 here comprises a first sensor 5A, a second sensor 5B, and a third sensor 5C, which are each configured to detect one or more respective physical quantities associated to operation of the electronic apparatus 1. Embodiments may comprise more, or fewer, sensors 5.

For instance, the first, the second and the third sensors 5A, 5B, 5C may each be, for example, one of an acceleration sensor, a temperature sensor, a pressure sensor, a mechanical-stress sensor, an electrical-resistance sensor, a gyroscope, etc.

In particular, in this embodiment, the first, the second and the third sensors 5A, 5B, are sensors of a MEMS type.

Further, the first, the second and the third sensors 5A, 5B, 5C are configured to supply each to the control unit 7, through the interface 10, a respective output signal $S_O$, of a digital type, which is a function of the one or more respective detected physical quantities and has an output frequency $f_{ou}$. In particular, the samples that form the output signals $S_O$ of the sensors 5 are supplied to and stored in the memory 8.

As described in detail hereinafter, the first, the second and the third sensors 5A, 5B, are configured to supply to the control unit 7 the samples of the respective output signals $S_O$ in a mutually synchronized way, so as to have the same output frequency $f_{ou}$ and the same phase (so as to be temporally aligned).

Figure 2:
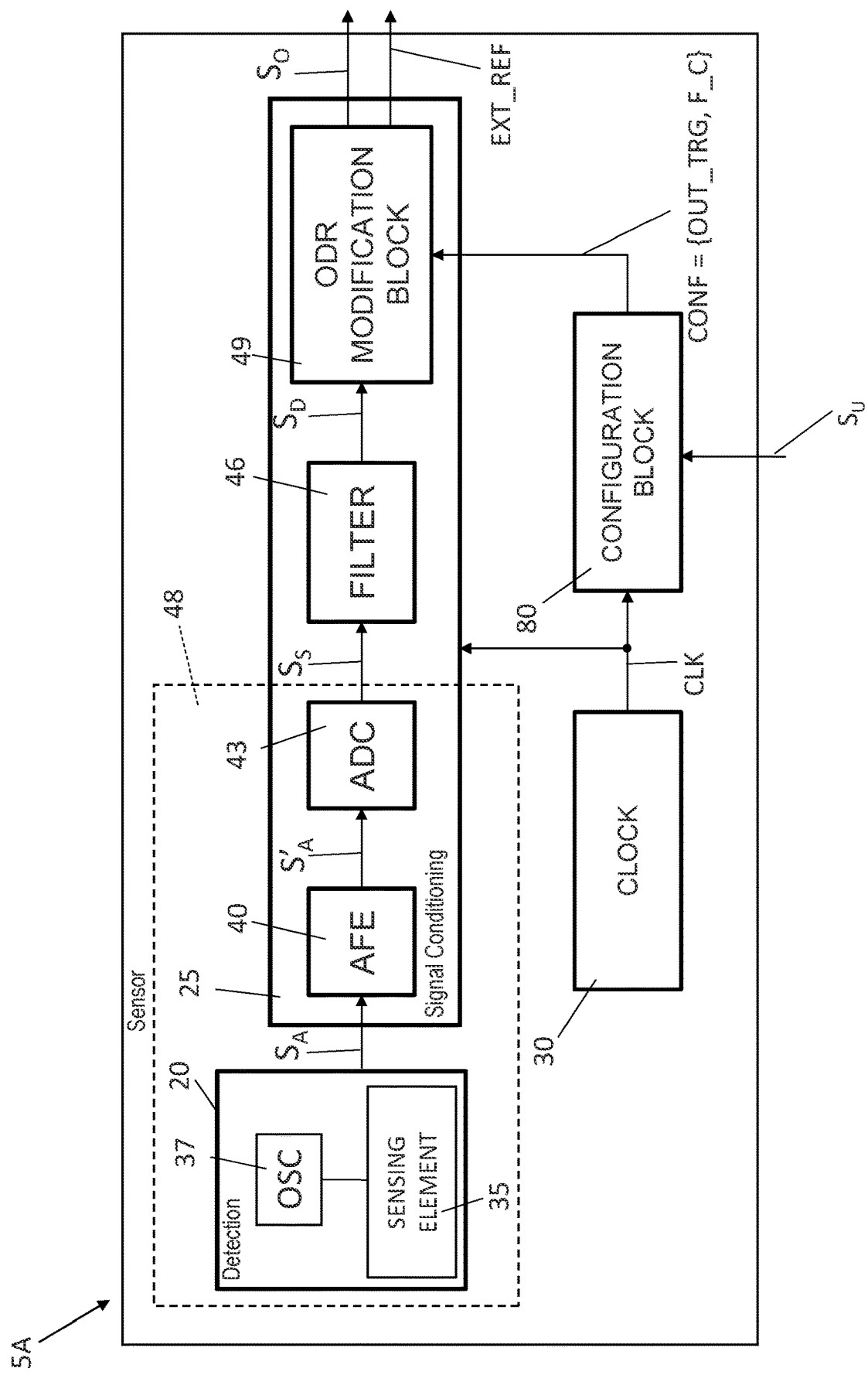
FIG. 2 shows a block diagram of an embodiment of a sensor of the electronic apparatus of FIG. 1.

In detail, in this embodiment, the first sensor 5A, illustrated in FIG. 2, is configured to operate as reference (or master) sensor, whereas the second and the third sensors 5B, 5C (FIG. 3) are configured to operate each as a slave sensor.

As described in detail hereinafter, here, the first, the second and the third sensors 5B, 5C may have a general structure similar to one another, apart from the differences discussed below; consequently, elements in common are designated by the same reference numbers. In particular, the second and third sensors 5B, 5C here may have a similar general structure except for the sensitive parts, which are each optimized for detecting the one or more specific physical quantities. Consequently, by way of example, FIG. 3 indiscriminately represents any of the second sensor 5B or the third sensor 5C.

Figure 3:
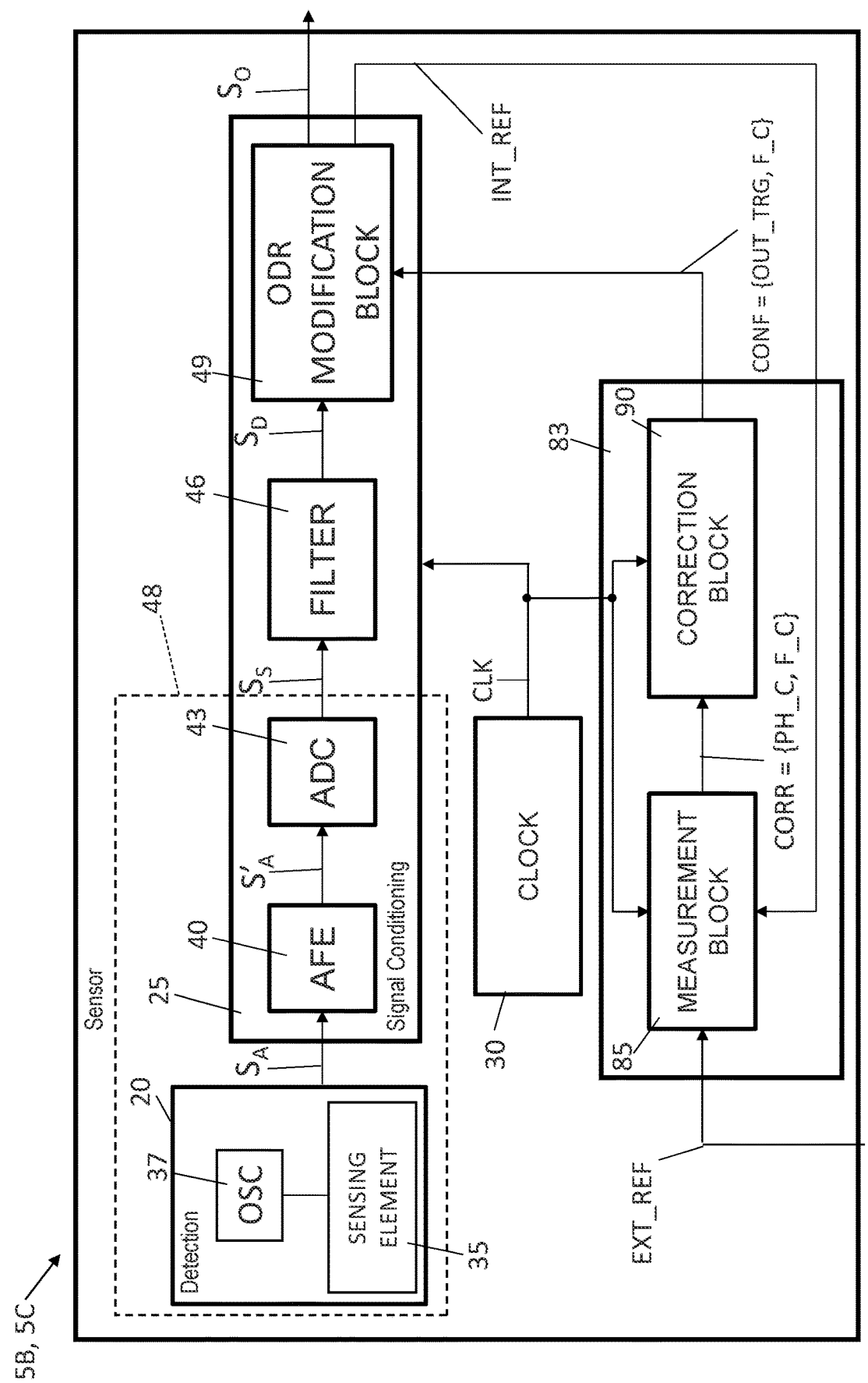
FIG. 3 shows a block diagram of an embodiment of another sensor of the electronic apparatus of FIG. 1.

As may be seen in FIGS. 2 and 3, the first, the second and the third sensors 5A, 5C each comprise a detection unit 20, a signal-conditioning stage 25, and a clock 30.

The detection unit 20 is the sensitive part of the first, the second and the third sensors 5A, 5B, 5C; the detection unit or circuit 20 is configured to detect a respective physical quantity associated to an operation of the electronic apparatus 1 and generate one or more electrical signals, here an analog signal $S_A$, as a function of said physical quantity.

In detail, in this embodiment, the detection unit 20 comprises a sensing element 35 and a mechanical oscillator 37.

The detection unit 20, in particular the sensing element 35 and/or the mechanical oscillator 37, of the first, the second and the third sensors 5A, 5B, 5C are designed on the basis of the specific physical quantity to be detected and the specific application; they may thus be different in each of the sensors 5. In particular, the second and the third sensors 5B, 5C may be the same as one another apart from differences in the respective sensing element 35 and/or in the respective mechanical oscillator 37.

The mechanical oscillator 37 comprises a structure that is mobile and/or deformable, for example in an elastic way, such as a cantilever, a membrane, or a structure having any other shape, with a resonance frequency $f_r$.

In use, the mechanical oscillator 37 is actuated, for example according to an electrostatic, piezoelectric, or electromagnetic actuation principle, so that the respective mobile and/or deformable structure oscillates at an operating frequency $f_o$. In general, the operating frequency $f_o$ is a function of the resonance frequency $f_r$, for example it is equal to the resonance frequency $f_r$.

The mechanical oscillator 37 is configured in such a way that the physical quantity to be detected modifies the movement of the mobile and/or deformable structure of the mechanical oscillator 37, for example modifying phase, amplitude and/or frequency thereof.

The sensing element 35 is configured to detect the movement of the mobile and/or deformable structure of the mechanical oscillator 37, for example according to an electrostatic, piezoresistive, piezoelectric or electromagnetic detection principle, and convert it into the analog signal $S_A$. The trend over time of the analog signal S A is thus indicative of the variations of movement of the mobile and/or deformable structure of the mechanical oscillator 37, these variations of movement being caused by the variations in time of the physical quantity to be detected.

The clock 30 is configured to supply a periodic signal, hereinafter clock signal CLK, for example, a square-wave signal, having a clock frequency $f_{clk}$, for example of the order of a few megahertz. For instance, the clock 30 may be formed by any type of known electronic oscillator, such as a voltage-controlled oscillator.

The signal-conditioning stage or circuit 25 receives the clock signal CLK and the analog signal $S_A$ and generates the output signal $S_O$. The output signal $S_O$ is obtained from the discretization of the analog signal $S_A$, as discussed hereinafter.

In detail, the signal-conditioning stage 25 comprises an analog conditioning circuit (or Analog Front-End, AFE) 40, an analog-to-digital converter 43, a filter 46, and an output-data-rate (ODR) modification block or circuit 49, hereinafter also designated as ODR modification block 49.

The analog conditioning circuit 40 comprises, for example, one or more operational amplifiers and is configured, for example, to filter, amplify or demodulate the analog signal $S_A$, providing a conditioned analog signal $S'_A$.

The analog-to-digital converter 43 is configured to receive the conditioned analog signal $S'_A$ and supply a sampled signal $S_S$. The sampled signal $S_S$ is obtained by discretizing the conditioned analog signal $S'_A$ at a sample frequency L.

The sample frequency $f_s$ is chosen at the design stage on the basis of the requirements of the specific application. For instance, the sample frequency $f_s$ is such as to satisfy the Nyquist sampling theorem, greater than twice the operating frequency $f_o$ of the mechanical oscillator 37 of the detection unit 20.

The sampled signal $S_S$ at output from the analog-to-digital converter 43 thus has a sample frequency that is equal to the sample frequency $f_s$.

The filter 46 comprises one or more filters of a low-pass or band-pass type, has one or more respective cut-off frequencies, and is configured to receive the sampled signal $S_S$ and supply a digital signal $S_D$. The digital signal $S_D$ is thus obtained by filtering the sampled signal $S_S$, for example to remove undesired spectral components thereof introduced by the analog-to-digital converter 43, the analog conditioning circuit 40, and/or the detection unit 20.

According to the specific application and design requirements, for example in order to meet a die area occupation requirement, the filter 46 may be configured also to reduce the frequency of the sampled signal $S_S$, for example by an integer reduction factor, for example comprised between 1 and 1024.

Thus, the digital signal S D has a conditioned sample frequency $f'_s$, which, here, is lower than the sample frequency $f_s$. In other applications, the conditioned sample frequency $f'_s$ is equal to the sample frequency $f_s$.

In this embodiment, the signal-conditioning stage 25 of the first, the second and the third sensors 5A, 5B, 5C also receives a respective set of configuration signals CONF comprising a frequency-selection signal F_C and an output-trigger signal OUT_TRG. Each signal-conditioning stage 25 further generates, as explained below, a respective reference signal EXT_REF, INT_REF.

In detail, the ODR modification block 49 is configured to receive the digital signal $S_D$ and the set of configuration signals CONF and supply the output signal $S_O$ and the reference signal EXT_REF, INT_REF.

The output signal $S_O$ is obtained from the digital signal $S_D$ by modifying the sample frequency thereof.

Here, the reference signal is indicated as external reference signal EXT_REF for the first sensor 5A (FIG. 2) and as internal reference signal INT_REF for the second sensor (FIG. 3) and for the third sensor 5C. The reference signals may be referred to as locking signals.

The external reference signal EXT_REF is a periodic signal, for example, a square-wave signal, which has, in this embodiment, a frequency equal to the output sample rate $f_{ou}$ of the output signal $S_O$ of the first sensor 5A.

However, in general, the frequency of the reference signal EXT_REF may be a submultiple of the output sample rate $f_{ou}$ of the output signal $S_O$ of the first sensor 5A.

In detail, the first sensor 5A is coupled to the second and the third sensors 5B, 5C and, in use, generates the external reference signal EXT_REF and supplies the external reference signal EXT_REF to the second sensor 5B and to the third sensor 5C.

The internal reference signal INT_REF of the second sensor 5B and the internal reference signal INT_REF of the third sensor 5C are each a periodic signal, for example, a square-wave signal, having a frequency equal to the output sample rate $f_{ou}$ of the respective output signal $S_O$.

As described in detail hereinafter, the second sensor 5B and the third sensor 5C each receive the external reference signal EXT_REF and generate a sample of the respective output signal $S_O$ in response to the comparison between the external reference signal EXT_REF and the respective internal reference signal INT_REF.

Figure 4:
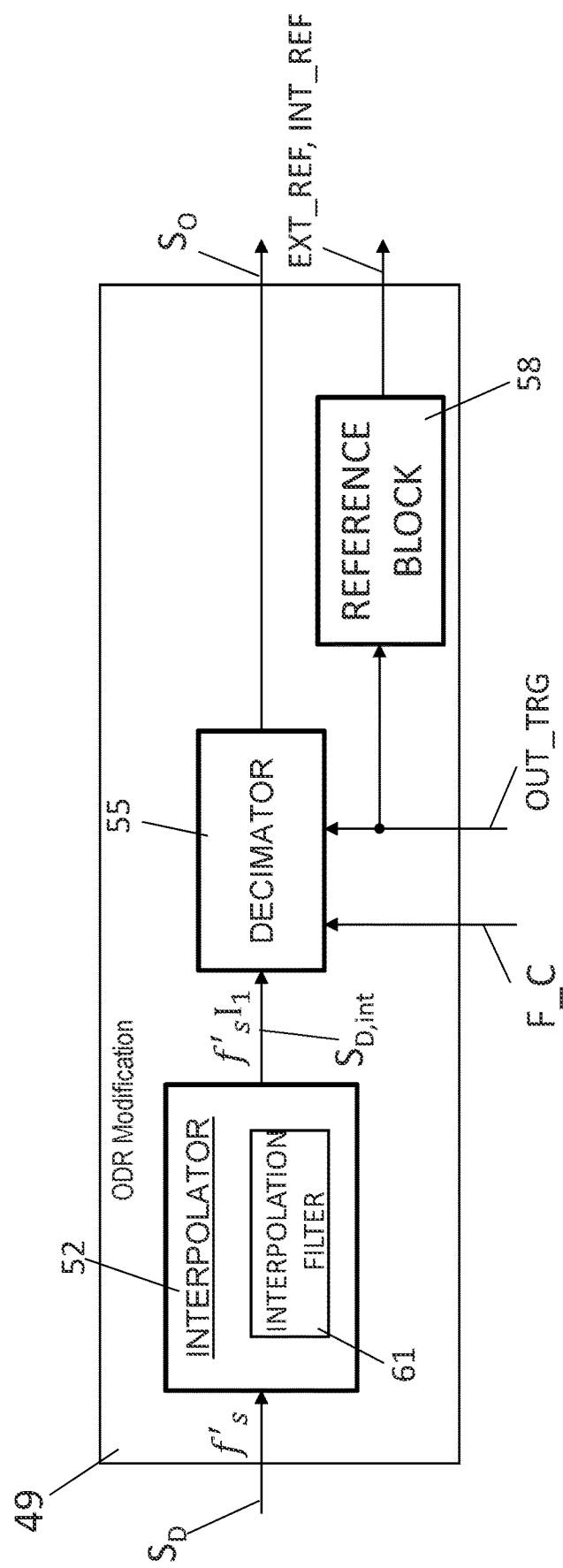
FIG. 4 shows the structure of a block of FIGS. 2 and 3 comprising a decimator according to an embodiment.

As illustrated in detail in FIG. 4, the ODR modification block 49 of the first, the second and the third sensors 5A, 5B, 5C comprises an interpolator 52, a decimator 55 and a reference block or circuit 58.

The interpolator 52 comprises an interpolation filter 61, is configured to receive at input the digital signal $S_D$, which has the conditioned sample frequency $f'_s$, and is configured to supply at output an interpolated digital signal $S_{D,int}$ having an interpolation frequency $f_{int}$ higher than the conditioned sample frequency $f'_s$. In particular, here, the interpolation frequency $f_{int}$ is obtained by incrementing the conditioned sample frequency $f'_s$ by an interpolation factor $I_1$, according to the formula $f_{int} = f'_s \cdot I_1$.

The interpolator 52, in particular the respective interpolation filter 61, may be obtained in a known way, using, for example, a linear or non-linear phase interpolation circuit, in particular of a CIC (Cascaded Integrator-Comb) type, a spline type, a lagrangian type, or a hermitian type.

The decimator 55 is configured to receive the interpolated digital signal $S_{D,int}$ and the set of configuration signals CONF and supply the output signal $S_O$ in response to reception of the output-trigger signal OUT_TRG.

Figure 5:
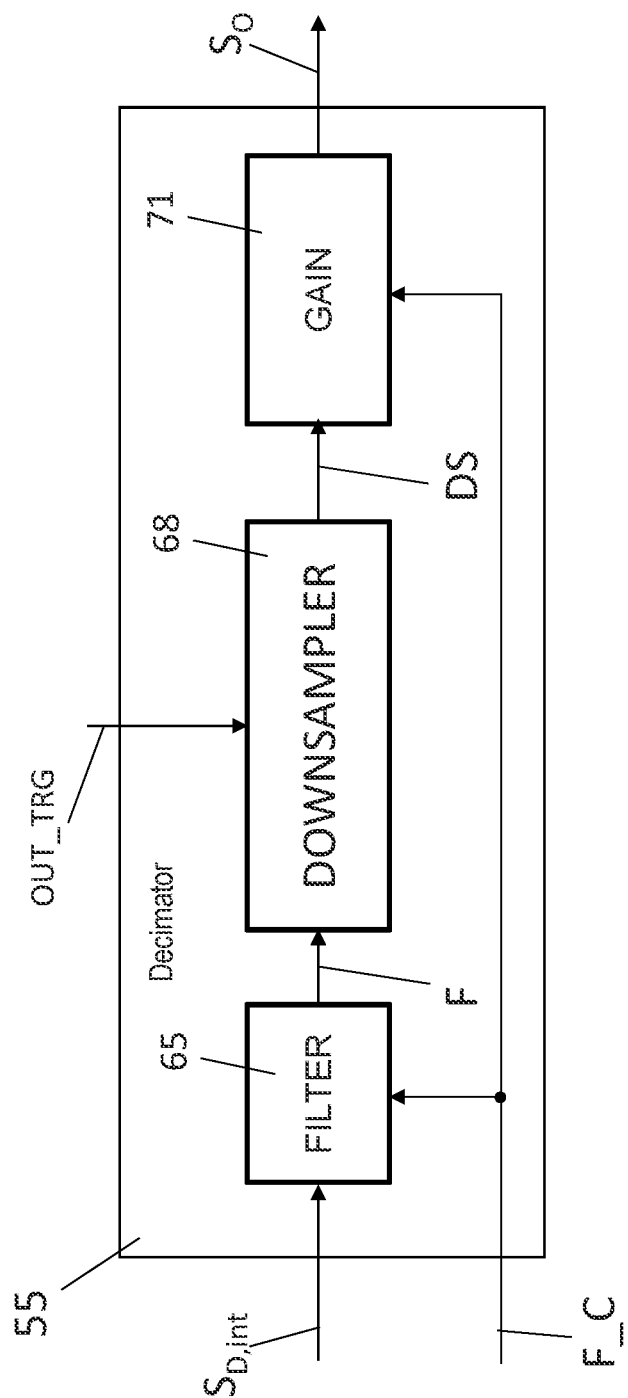
FIG. 5 shows the structure of the decimator of the block of FIG. 4 according to an embodiment.

In detail, as illustrated in FIG. 5, the decimator 55 comprises a filtering stage or circuit 65, a downsampler 68, and a gain block or circuit 71, cascaded to one another.

The filtering stage 65 is a low-pass filter, for example an infinite-impulse-response (IIR) filter or a finite-impulse-response (FIR) filter, such as a CIC circuit, and is configured to receive the frequency-selection signal F_C and the interpolated digital signal $S_{D,int}$ and supply a filtered signal F.

The filtering stage 65 has a transfer function having a cut-off frequency G, which is chosen on the basis of the output frequency $f_{out}$, in particular on the basis of the frequency-selection signal F_C.

For instance, the cut-off frequency $f_c$ is chosen in such a way that the ratio between the frequency of the output signal $S_O$ and the cut-off frequency $f_c$ complies with the Nyquist sampling theorem. Moreover, the cut-off frequency $f_c$ is chosen so as to suppress the high-frequency spectral images introduced by the interpolator 52.

The transfer function of the filtering stage 65, in particular the cut-off frequency $f_c$, may be modified, in use, in a known way. For instance, in the case where the filtering stage 65 is formed by a CIC filter of order N, the corresponding coefficients that determine the transfer function thereof may be determined, in a known way, from the ratio between the frequency of the output signal $S_O$ and the frequency of the interpolated digital signal $S_{D,int}$. In the case where the filtering stage 65 is formed by an IIR filter, the corresponding coefficients that determine the transfer function thereof may be chosen from a specific look-up table, for example stored in the memory 8.

The downsampler 68 is configured to receive the filtered signal F and the output-trigger signal OUT_TRG and supply a downsampled signal DS.

In detail, the downsampler 68 is configured, in response to the reception of a first sample $F_i(t_1)$ of the filtered signal F at a first instant $t_1$, to store the first sample $F_i(t_1)$ and, in response to the reception of a second sample $F_i(t_2)$ of the filtered signal F at a second instant $t_2$ subsequent to the first instant $t_1$, to overwrite the first sample $F_i(t_1)$ with the second sample $F_i(t_2)$.

The downsampler 68 is configured, in response to the detection of an event, in particular a switching edge, of the output-trigger signal OUT_TRG, for example a rising edge or a falling edge, to supply at output the sample $F_i$ of the filtered signal F currently stored. For instance, if the downsampler 68 does not detect any event of the output-trigger signal OUT_TRG between the first instant $t_1$ and the second instant $t_2$, and detects an event of the output-trigger signal OUT_TRG subsequent to the second instant $t_2$, then the downsampler 68 supplies at output the second sample $F_i(t_2)$ of the filtered signal F. The set of the samples $F_i$ supplied at output constitutes the downsampled signal DS.

In other words, the downsampler 68 is configured to cause the sample frequency of the downsampled signal DS to be lower than, or at the most equal to, that of the filtered signal F.

The gain block 71 is configured to receive the downsampled signal DS and the frequency-selection signal F_C and supply the output signal $S_O$.

In detail, the gain block 71 is configured to amplify or attenuate, by a gain factor G, the value of the samples $F_i$ of the downsampled signal DS corresponding to a d.c. component (the component at zero frequency) of the downsampled signal DS. For instance, the component at zero frequency of the downsampled signal DS is identified by performing a Fourier transform of the downsampled signal DS. The gain factor G is chosen as a function of the frequency-selection signal F_C and as a function of the type of filter used in the filtering stage 65.

In particular, if the filtering stage 65 is obtained using an IIR filter, then the gain factor G may be chosen from a specific table, stored in the memory 8. If the filtering stage 43 is obtained using a CIC filter, then the gain factor G may be calculated as $1/D_1^N$, wherein N is the order of the CIC filter of the filtering stage 65 and $D_1$ is a value indicative of the ratio between the frequency of the output signal $S_O$ and that of the interpolated digital signal $S_{D,int}$.

In practice, in use, supplying a sample of the respective digital signal $S_D$ by the ODR modification block 49 of the reference sensor 5A and of the slave sensors 5B, 5C comprises upsampling the respective digital signal $S_D$, thereby generating an interpolated signal $S_{D,int}$ and downsampling the interpolated signal $S_{D,int}$, thereby generating the respective output signal $S_O$.

Furthermore, downsampling the interpolated signal $S_{D,int}$ comprises filtering the interpolated signal by a low-pass filter (filtering stage 65), which has a cut-off frequency fc, thus obtaining the filtered signal F; downsampling the filtered signal F in response to the reception, by the reference sensor 5A and the slave sensor 5B, 5C, of the respective output-trigger signal OUT_TRG, thus obtaining a downsampled signal DS, which has a d.c. component; and modifying the d.c. component of the downsampled signal DS through amplification or attenuation of the d.c. component, using the gain value G.

The reference block or circuit 58 (FIG. 4) is configured to receive the output-trigger signal OUT_TRG and supply the respective reference signal (the external reference signal EXT_REF in the case of the first sensor 5A and the internal reference signal INT_REF in the case of the second and third sensors 5B, 5C), in response to the reception of the respective output-trigger signal OUT_TRG.

In detail, the reference block 58 is configured, in response to the reception of the respective output-trigger signal OUT_TRG, in particular in response to the detection of a switching event or switching edge of the output-trigger signal OUT_TRG, for example a rising edge or a falling edge thereof, to generate a switching edge of the respective reference signal, for example a rising edge or a falling edge thereof. In other words, the switching edge of the external reference signal EXT_REF of the first sensor 5A is temporally aligned with the sample of the output signal $S_O$ of the first sensor 5A supplied in response to reception of the respective output-trigger signal OUT_TRG.

Likewise, the switching edge of the internal reference signal INT_REF of the second sensor 5B is temporally aligned with the sample of the output signal $S_O$ of the second sensor 5B supplied in response to the reception of the respective output-trigger signal OUT_TRG. In addition, the switching edge of the internal reference signal INT_REF of the third sensor 5C is temporally aligned with the sample of the output signal $S_O$ of the third sensor 5C supplied in response to the reception of the respective output-trigger signal OUT_TRG.

Again with reference to FIG. 2, the first sensor 5A further comprises a configuration block or circuit 80, which is configured to receive the respective clock signal CLK and a user signal Su, and generate the respective set of configuration signals CONF.

As illustrated in FIG. 1, the user signal Su is sent by the control unit 7 to the first sensor 5A via the interface 10 and is indicative of the desired output-data rate ODR E from the plurality of sensors 5.

For instance, in use, a user of the electronic apparatus 1 may indicate the desired output-data rate $ODR_E$ via the peripheral units 12.

In this embodiment, the user signal Su indicates a setting value N s equal to a number of cycles, for example a number of rising or falling edges, of the clock signal CLK of the first sensor 5A. The configuration block 80 (FIG. 2) of the first sensor 5A is configured to count the cycles of the respective clock signal CLK and generate, every number of cycles of the respective clock signal CLK equal to the setting value $N_s$, the respective set of configuration signals CONF. In particular, the frequency-selection signal F_C of the first sensor 5A is indicative of the setting value $N_s$.

With reference to FIG. 3, the configuration block or circuit of the second and third sensors 5B, 5C, designated by 83, is configured to receive the clock signal CLK from the respective clock 30, the internal reference signal INT_REF from the respective reference block 58 (see FIG. 4), and the external reference signal EXT_REF from the first sensor 5A and generate the respective set of configuration signals CONF.

The configuration block 83 of the second sensor 5B and the configuration block 83 of the third sensor 5C each comprise a respective measurement block or circuit 85 and a respective correction block or circuit 90.

The measurement block 85 of the second and the third sensors 5B, 5C is configured to receive the respective clock signal CLK, the respective internal reference signal INT_REF, and the external reference signal EXT_REF; and generate a respective set of correction signals CORR comprising a phase-correction signal PH_C and the frequency-selection signal F_C.

Figure 6:
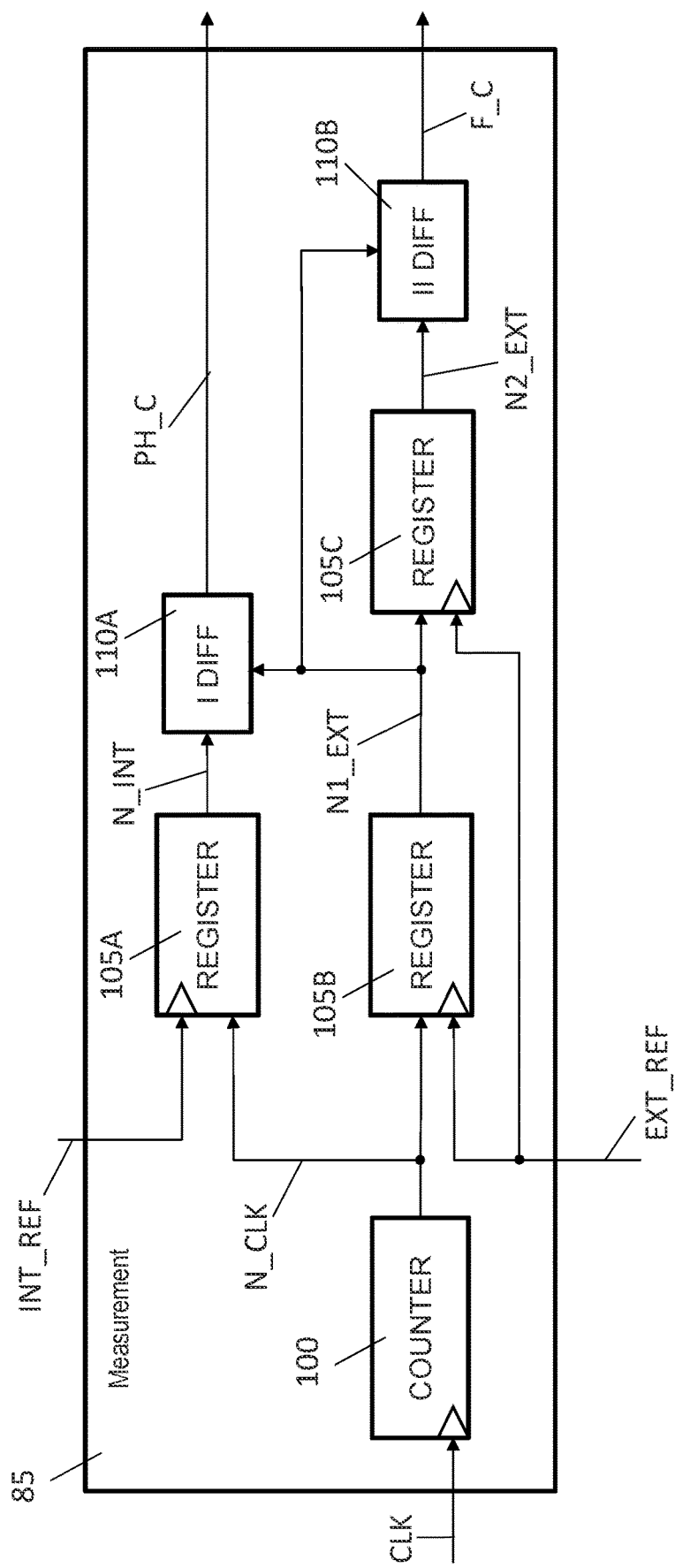
FIG. 6 shows the structure of a block of the sensor of FIG. 3 according to an embodiment.

As illustrated in detail in FIG. 6, the measurement block 85 comprises a counter 100, a first register 105A, a second register 105B, a third register 105C, a first subtraction device 110A and a second subtraction device 110B.

The counter 100 is a free-running counter configured to receive the clock signal CLK, to store a count number, and to supply a clock-count signal N_CLK indicative of the count number. The counter 100 increments the count number by one unit at each cycle of the clock signal CLK (for example, at each rising edge or falling edge). In other words, the count number has an increasing monotonic value equal to the number of cycles of the clock signal CLK counted from a last reset of the counter 100, for example upon a restart of the electronic apparatus 1.

The first register 105A is configured to receive and store the clock-count signal N_CLK, receive the internal reference signal INT_REF, and supply an internal phase signal N_INT, in response to the detection of a switching edge, for example a rising edge or a falling edge, of the internal reference signal INT_REF. The internal phase signal N_INT is equal to the value of the clock-count signal N_CLK stored in the first register 105A upon detection of the switching edge of the internal reference signal INT_REF.

The second register 105B is configured to receive and store the clock-count signal N_CLK, receive the external reference signal EXT_REF, and supply a first external count signal N1_EXT in response to the detection of a switching edge, for example a rising edge or a falling edge, of the external reference signal EXT_REF. The first external count signal N1_EXT is equal to the value of the clock-count signal N_CLK stored in the second register 105B upon detection of the switching edge of the external reference signal EXT_REF.

The first subtraction element 110A is configured to receive the internal phase signal N_INT and the first external count signal N1_EXT and supply the phase-correction signal PH_C. The phase-correction signal PH_C is given by the difference between the internal phase signal N_INT and the first external count signal N1_EXT and corresponds to a number of phase-shift cycles Nd of the clock signal CLK. As may be seen in FIG. 7, the phase-correction signal PH_C is indicative of the phase difference $\Delta\Phi$ between the internal phase signal N_INT and the first external count signal N1_EXT.

In other words, the phase-correction signal PH_C generated by the measurement block 85 of the second sensor 5B is indicative of the temporal offset (phase shift), expressed as number of cycles of the clock signal CLK of the second sensor 5B, between the internal reference signal INT_REF of the second sensor 5B and the external reference signal EXT_REF; in particular, between a rising edge of the internal reference signal INT_REF of the second sensor 5B and a rising edge of the external reference signal EXT_REF.

Likewise, the phase-correction signal PH_C generated by the measurement block of the third sensor 5C is indicative of the phase shift, expressed as number of cycles of the clock signal CLK of the third sensor 5C, between the internal reference signal INT_REF of the third sensor 5C and the external reference signal EXT_REF; in particular, between a rising edge of the internal reference signal INT_REF of the third sensor 5C and a rising edge of the external reference signal EXT_REF.

Again with reference to FIG. 6, the third register 105C is configured to receive and store the first external count signal N1_EXT, receive the external reference signal EXT_REF, and supply a second external count signal N2_EXT, in response to the detection of a switching edge, for example a rising edge or a falling edge, of the external reference signal EXT_REF. The second external count signal N2_EXT is equal to the value of the first external count signal N1_EXT stored in the third register 105C upon detection of the switching edge of the external reference signal EXT_REF.

The second subtraction element 110B is configured to receive the first external count signal N1_EXT and the second external count signal N2_EXT and supply the frequency-selection signal F_C. The frequency-selection signal F_C is given by the difference between the first external count signal N1_EXT and the second external count signal N2_EXT and corresponds to a number of frequency cycles Nf of the clock signal CLK. As may be seen in FIG. 7, the frequency-selection signal F_C is indicative of the time difference $\Delta t$ between two successive switching edges, in particular two successive rising edges, of the external reference signal EXT_REF.

In practice, the frequency-selection signals F_C generated by the measurement blocks 85 of the second and the third sensors 5B, 5C are indicative of the frequency, expressed as number of cycles of the clock signal CLK of the second sensor 5B, respectively the third sensor 5C, of the external reference signal EXT_REF, of the output frequency $f_{ou}$ of the output signal $S_O$ of the first sensor 5A, and thus of the desired output-data rate $ODR_E$ from the plurality of sensors 5.

Figure 8:
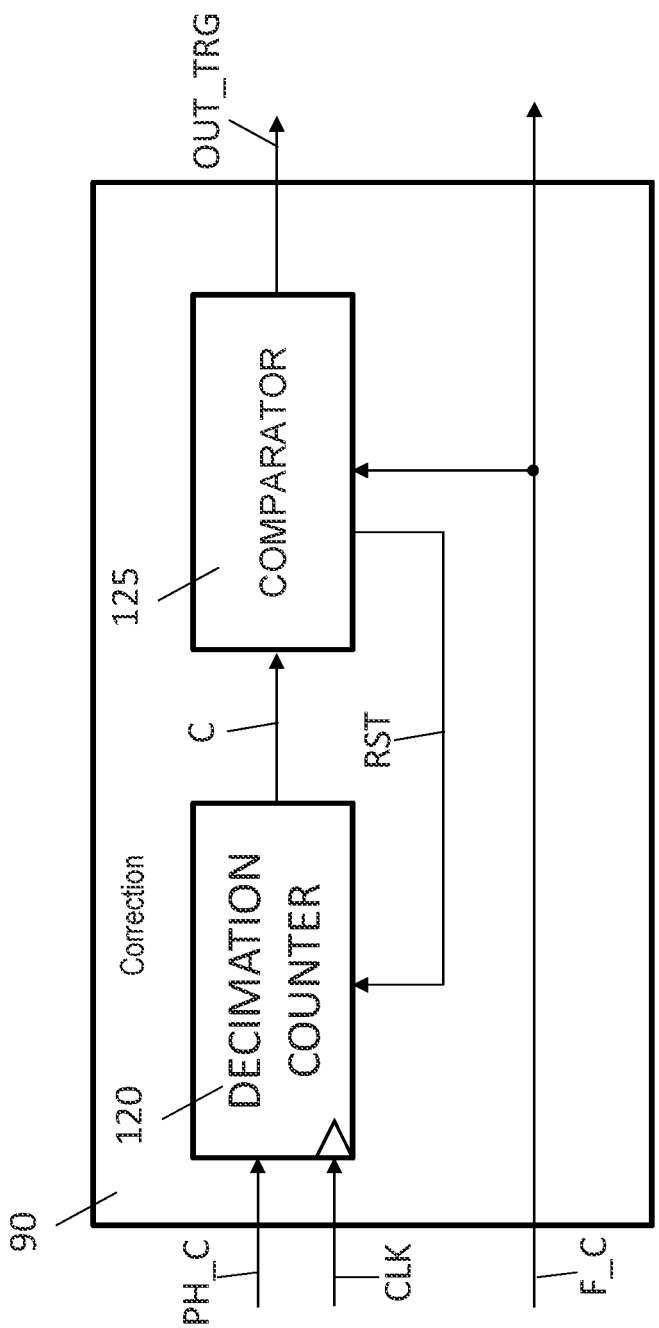
FIG. 8 shows the structure of another block of the sensor of FIG. 3 according to an embodiment.

FIG. 8 shows a possible implementation of the correction block 90 of the second sensor 5B and of the third sensor 5C.

In detail, the correction block 90 of FIG. 8 comprises a decimation counter 120 and a comparator 125, cascaded to the decimation counter 120.

The decimation counter 120 is configured to receive, from the respective measurement block 85 (FIG. 3), the phase-correction signal PH_C; receive, from the respective clock 30, the clock signal CLK; store a respective decimation count number k; and supply a respective comparison signal C indicative of the decimation count number k.

The comparator 125 is configured to receive the comparison signal C and the frequency-selection signal F_C and generate the output-trigger signal OUT_TRG upon the occurrence of a trigger condition.

In this embodiment, the comparator 125 is also configured to supply, upon the occurrence of the trigger condition, a reset signal RST to the decimation counter 120.

Figure 9:
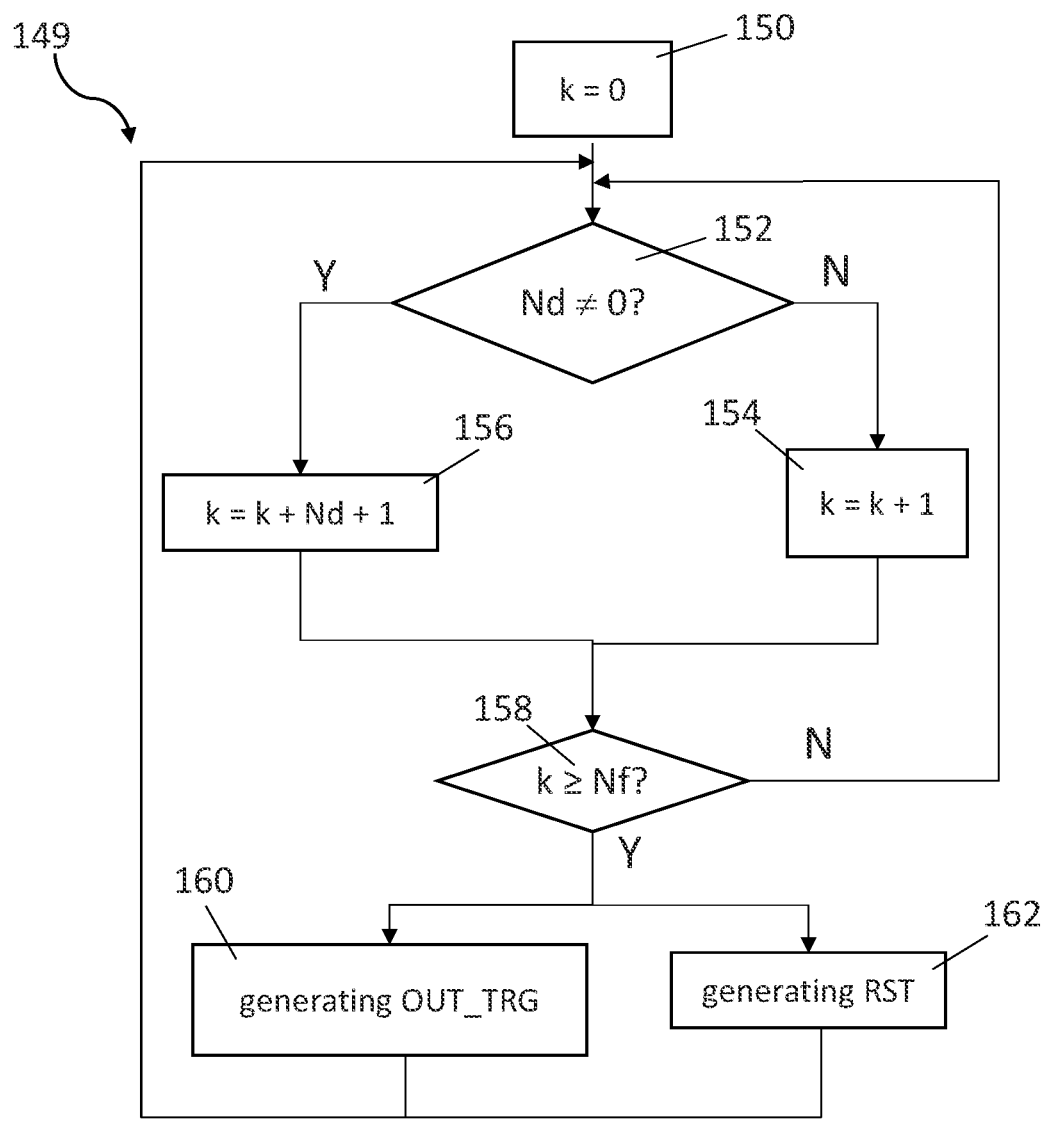
FIG. 9 shows a flowchart of a method performed by the block of FIG. 8 according to an embodiment.

Operation of the correction block 90 of FIG. 8 is represented in the flowchart 149 of FIG. 9.

In detail, in an initial step 150, for example upon start-up of the electronic apparatus 1, the decimation counter 120 resets to zero the value of the decimation count number k. Next, at each cycle of the clock signal CLK, for example at each rising edge or falling edge of the clock signal CLK, the counter 120 verifies whether (step 152) the phase-correction signal PH_C, the number of phase-shift cycles Nd, is different from zero. If not (output N from step 152), the decimation counter 120 updates the decimation count number k, incrementing it by one unit (step 154). If yes (output Y from step 152), the decimation counter 120 updates the decimation count number k, incrementing it by one unit and by the value indicated by the phase-correction signal PH_C (step 156); k=k+1+Nd.

The comparator 125 then verifies the trigger condition (step 158), by comparing the value indicated by the comparison signal C (the decimation count number k) with the value indicated by the frequency-selection signal F_C. In particular, the trigger condition comprises verifying whether the decimation count number k is greater than or equal to the number of frequency cycles Nf indicated by the frequency-selection signal F_C.

If not (output N from step 158), the correction block 90 repeats step 152.

If yes (output Y from step 158), the comparator 125 generates the output-trigger signal OUT_TRG (step 160) and the reset signal RST (step 162).

In response to the reception of the reset signal RST, the decimation counter 120 resets the decimation count number k. In this embodiment, the decimation counter 120 resets the decimation count number k to a value equal to the result of a modulo operation between the decimation count number k and the number of frequency cycles Nf; k=mod(k, Nf).

The correction block 90 then returns to step 152.

In practice, in use, and with reference to FIGS. 1 and 2, the user signal Su sent by a user of the electronic apparatus 1 to the first sensor 5A sets a desired output-data rate ODR E from the first sensor 5A, the desired output frequency $f_{ou}$ of the respective output signal $S_O$.

In particular, the output-trigger signal OUT_TRG of the first sensor 5A is generated by the respective configuration block 80 so as to trigger the decimator 55 (FIG. 4) to supply the samples of the output signal $S_O$ at the output frequency $f_{ou}$.

The reference block 58 of the first sensor 5A generates, in response to the reception of the output-trigger signal OUT_TRG, the external reference signal EXT_REF, so that the rising (or falling) edges thereof are generated with the same phase and frequency as the samples of the output signal $S_O$ of the first sensor 5A.

The external reference signal EXT_REF, supplied by the first sensor 5A to the second and the third sensors 5B, 5C, is thus used by the latter for setting the frequency of the samples of the respective output signals $S_O$, as discussed in detail with reference to FIGS. 6-9.

Further, the second and the third sensors 5B, 5C in turn each generate, by the respective reference block 58, the respective internal reference signal INT_REF, in response to the reception of the respective output-trigger signal OUT_TRG. The rising (or falling) edges of the internal reference signal INT_REF of the second sensor 5B are generated with the same phase and frequency as the samples of the output signal $S_O$ of the second sensor 5B. Likewise, the rising (or falling) edges of the internal reference signal INT_REF of the third sensor 5C are generated with the same phase and frequency as the samples of the output signal $S_O$ of the third sensor 5C.

Figure 7:
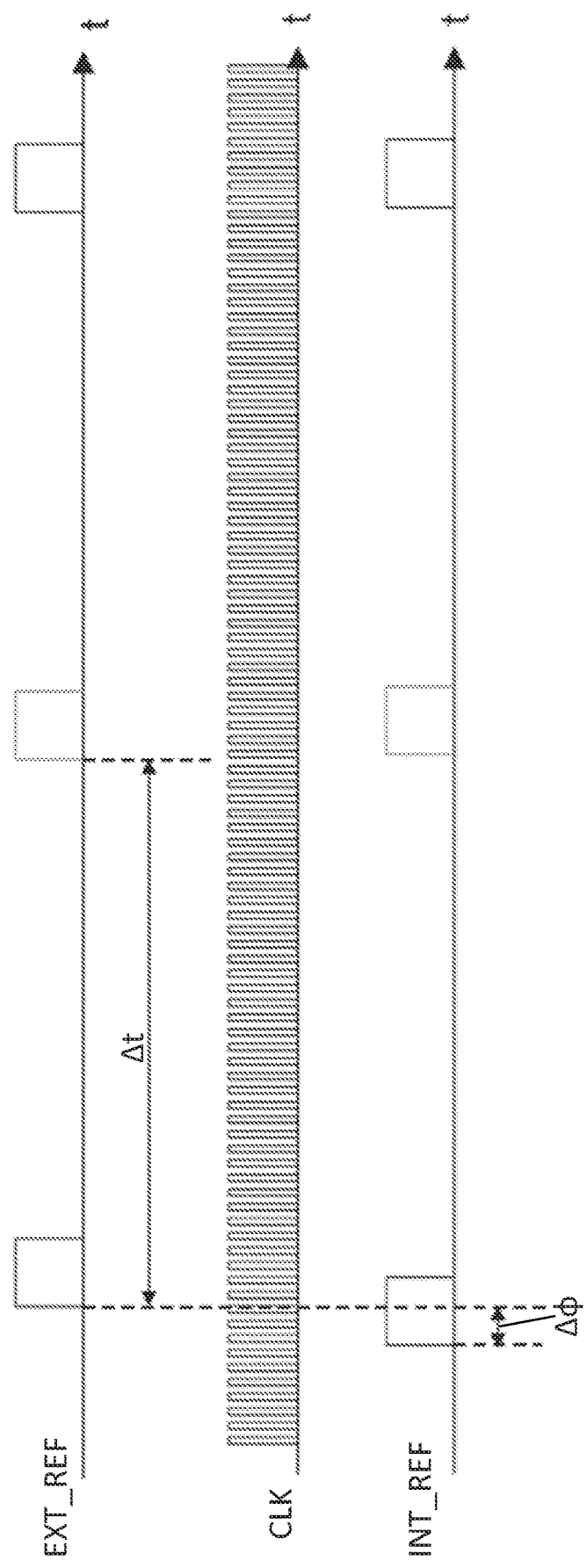
FIG. 7 shows an example trend over time of input signals of the block of FIG. 6, in use.

Accordingly, since the second and the third sensors 5B, 5C each compare the external reference signal EXT_REF with the respective internal reference signal INT_REF, as described in detail with reference to FIGS. 6-9, they are also able to temporally align the respective output signals $S_O$ with the output signal $S_O$ of the first sensor 5A, thereby compensating possible phase offsets (for example, the phase difference $\Delta\Phi$ of FIG. 7).

Consequently, except for an initial transient period subsequent to the start-up of the electronic apparatus 1, for example after an initial number of adjustment samples of the output signals $S_O$ of the plurality of sensors 5, for example comprised between 1 and 100, the first, the second, and the third sensors 5A, 5B, 5C generate in a mutually synchronized way the samples of the respective output signal $S_O$. In particular, in an embodiment the samples of the output signals $S_O$ of the plurality of sensors 5 are temporally coherent with one another; not only do they have the same output frequency $f_{ou}$, but they are also temporally aligned with one another (they are in phase).

This facilitates obtaining numerous advantages.

In fact, the fact that the sensors 5 supply the samples of the respective output signals $S_O$ simultaneously to the memory 8, means that the control unit 7 of the electronic apparatus 1 may be configured to read at once, and at the output frequency $f_{ou}$, the data received from all the sensors 5, from the memory 8. Consequently, the control unit 7 may assign a shorter time to the activity of data collection. This means that the electronic apparatus 1 has a lower energy consumption with respect to the case where the samples of the output signals $S_O$ were not synchronized, wherein the control unit 7 should periodically control the effective arrival of said samples. Alternatively, the time saved by the control unit 7 in the data acquisition may be used in other activities, thereby increasing the performance of the electronic apparatus 1 and/or improving the operating efficiency.

Furthermore, in the electronic apparatus 1 the plurality of sensors 5 is able to self-synchronize by implementing the transmission of just one signal (the external reference signal EXT_REF) among the sensors 5. Moreover, use by the second and the third sensors 5C of the external reference signal EXT_REF and of the respective internal reference signal INT_REF enables to compensate possible variations of behaviour of the clocks 30, for example offset and drift due to the change of conditions of use, such as temperature.

In other words, synchronization of the data at output from the sensors 5 of the electronic apparatus 1 may occur without the control unit 7 being configured to execute complex synchronization protocols, which would involve conspicuous hardware and software resources. Also for this reason, the electronic apparatus 1 has an improved efficiency.

In addition, the interface 10 may be a generic and known communication interface. This enables a high versatility of use of the plurality of sensors 5, which may be easily incorporated in the electronic apparatus 1.

At the same time, the fact that the output signals $S_O$ of the sensors 5 are temporally coherent (aligned in frequency and phase), enables the control unit 7 to use the data supplied by the sensors 5 properly in a subsequent processing operation, for example for a subsequent combined processing of the data of the sensors 5 to execute advanced functions of the electronic apparatus 1, for example multi-sensor data-fusion processes, advanced compensations, batching in a buffer, in particular of a FIFO (First-In/First-Out) type.

Figure 10:
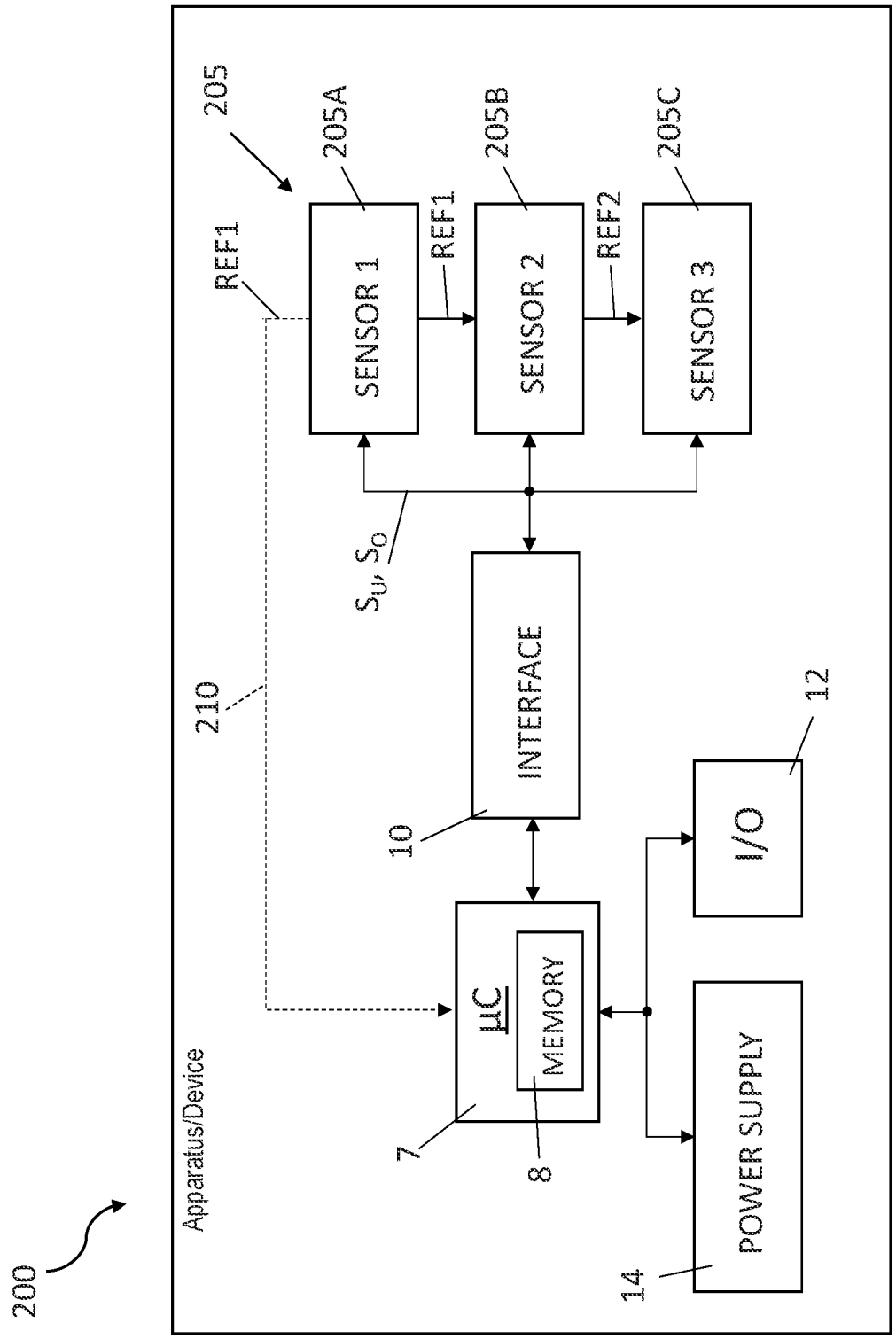
FIG. 10 shows a block diagram of an electronic apparatus comprising a plurality of sensors, according to an embodiment.

FIG. 10 shows a different embodiment of the present electronic apparatus, here designated by 200.

The electronic apparatus 200 has a general structure similar to that of the electronic apparatus 1 of FIG. 1; consequently, elements in common have the same reference numbers and are described briefly.

In detail, the electronic apparatus 200 comprises the control unit or circuit 7, the memory 8, the interface 10 and a plurality of sensors, here designated by 205.

Furthermore, also here, the electronic apparatus 200 comprises the power-supply unit 14 and the input and output peripherals 12.

The plurality of sensors 205 also here comprises a first sensor 205A, a second sensor 205B, and a third sensor 205C. Fewer or additional sensors may be employed in various embodiments.

The first sensor 205A has an equal structure to the first sensor 5A of FIG. 1 and is consequently not illustrated any further, reference being made to the description of FIG. 2.

In the present embodiment, the first sensor 205A generates a reference signal, which is referred to as the first external reference signal REF1 and is intended to be supplied only to the second sensor 205B.

Figure 11:
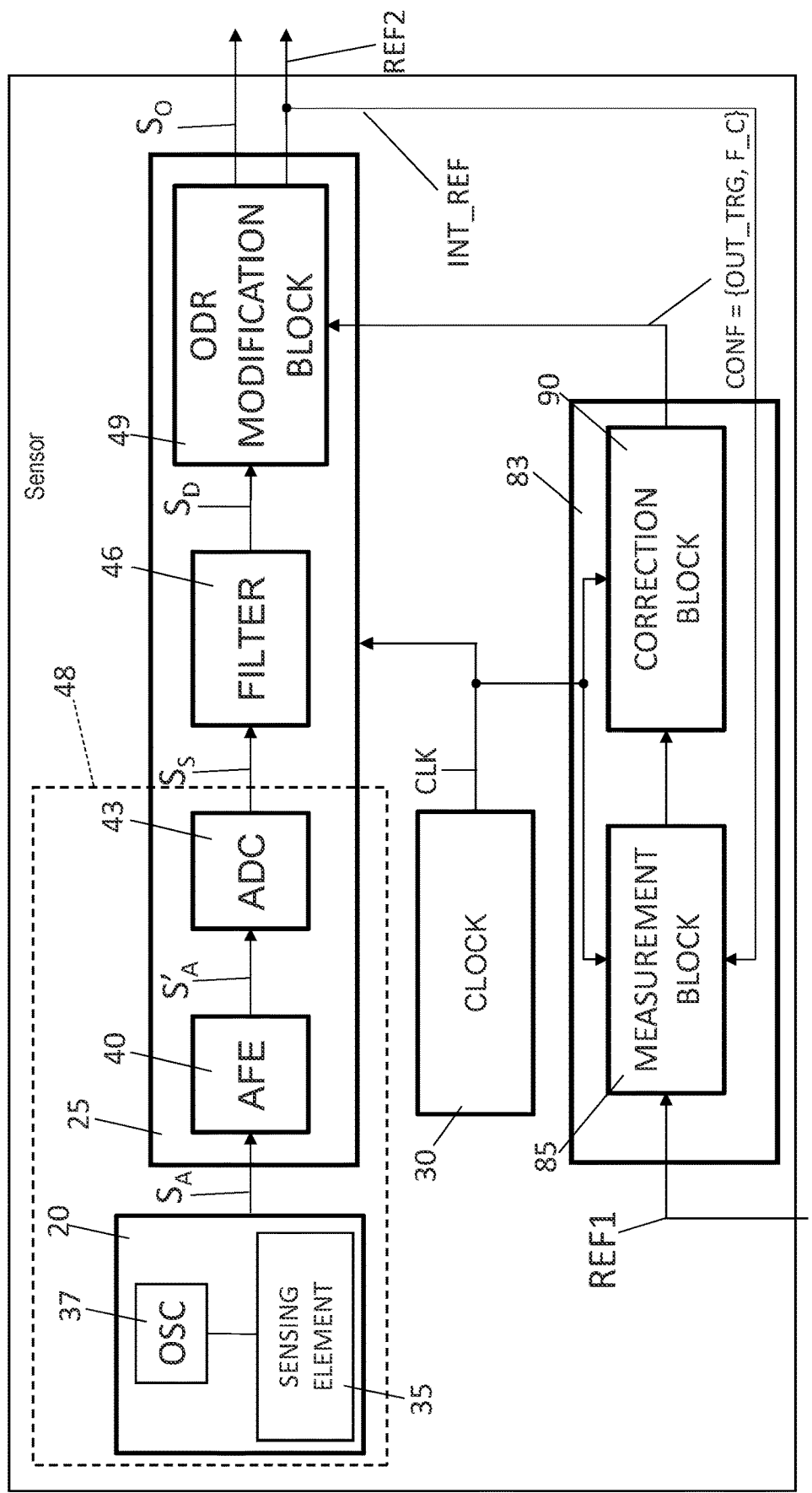
FIG. 11 shows a block diagram of a sensor of the electronic apparatus of FIG. 10 according to an embodiment.

The second sensor 205B, whose block diagram is illustrated in FIG. 11, also here comprises the detection unit 20, the signal-conditioning stage 25 including the ODR modification block 49, the clock 30 and the synchronization block 83 including the measurement block 85 and the correction block 90.

The synchronization block 83, in particular the measurement block 85, is here configured to receive at input the respective internal reference signal INT_REF and, as external reference signal, the first external reference signal REF1 generated by the first sensor 205A.

In this embodiment, the second sensor 205B is configured to generate also a second external reference signal REF2 and supply it to the third sensor 205C. The second external reference signal REF2 is a periodic signal, for example, a square-wave signal, the rising (or falling) edges of which are aligned with the samples of the respective output signal $S_O$.

In detail, in this embodiment, the second external reference signal REF2 is generated by the reference block 58 of the ODR modification block 49 and is the same as the internal reference signal INT_REF.

The third sensor 205C has an equal structure to the second sensor 205B illustrated in FIG. 11 and is consequently not illustrated any further. The third sensor 205C also here comprises the detection unit 20, the signal-conditioning stage 25 comprising the ODR modification block 49, the clock 30 and the synchronization block 83 including the measurement block 85 and the correction block 90. However, the synchronization block 83, in particular the measurement block 85, here receives at input, in addition to the respective internal reference signal INT_REF, the second external reference signal REF2 generated by the second sensor 205B, as external reference signal.

Thus, in this embodiment, the second sensor 205B operates both as slave sensor, with respect to the first sensor 205A, and as reference sensor, with respect to the third sensor 205C.

In practice, the plurality of sensors 205 of the apparatus 200 is configured to execute a self-synchronization, in a way similar to what has been described above for the electronic apparatus 1. Consequently, the electronic apparatus 200 shares the potential advantages, discussed above, of the electronic apparatus 1.

Finally, it is clear that modifications and variations may be made to the present electronic apparatus 1, 200 and to the corresponding synchronization method, described and illustrated herein, without thereby departing from the scope of the present disclosure, as defined in the annexed claims.

For instance, the various embodiments described may be combined so as to provide further solutions.

For example, in the electronic apparatus 1 of FIG. 1, the first sensor 5A may supply the external reference signal EXT_REF also to the control unit 7 via a dedicated connection 210, which is represented by a dashed arrow in FIG. 1. In this way, the control unit 7 may read the samples of the output signals $S_O$ in response to the reception of the external reference signal EXT_REF.

Similarly, in the electronic apparatus 200 of FIG. 10, the first sensor 5A may send the first external reference signal REF1 to the control unit 7 through a dedicated connection, which is also here designated by 210 and represented by a dashed arrow. In a further embodiment, the second sensor 5B may send the second external reference signal REF2 to the control unit 7 through a respective dedicated connection. In this way, the control unit 7 may read the samples of the output signals $S_O$ in response to the reception of the first external reference signal REF1 or of the second external reference signal REF2.

For instance, the control unit 7 may be configured to read the samples of the output signals $S_O$ at intervals corresponding to submultiples of the output frequency $f_{out}$, with consequent energy saving.

For example, the sensors 5, 205 may have the same structure and be configured to operate, each, both as reference sensor and as slave sensor. In a step of initial configuration of the electronic apparatus 1, 200, a user of the electronic apparatus 1, 200 may choose which sensor to use as reference sensor by sending specific configuration instructions through the interface 10. In particular, the user may choose, as reference sensor, the sensor having the lower operating frequency $f_o$.

The sensors 5, 205 may be mutually equal, to detect the same physical quantities in different conditions and/or positions, or else may be different, to detect different physical quantities.

The sensors 5, 205 may also differ as regards the respective clock 30. For instance, the sensors 5, 205 may each have a respective clock 30 of a different type; in particular, they may each have a respective clock frequency $f_{clk}$.

The sensors 5, 205 may each be formed in a respective die or in a number of dies of semiconductor material; further, a number of sensors may be formed in just one die. In particular, for each sensor 5, the detection unit 20 may be formed in a distinct die with respect to the other circuit components, with respect to the signal-conditioning stage 25, the clock 30 and the synchronization block 80, 83. Alternatively, for each sensor of the plurality of sensors 5, the components of an analog type, for example the analog conditioning circuit 40, may be formed in a different die with respect to the components of a digital type, for example the clock 30, the ODR modifier block 49 and the synchronization block 80, 83.

As an alternative to what has been illustrated, for each sensor 5, 205, a die may integrate both the respective detection unit 20 and part of the signal-conditioning stage 25, in particular the analog conditioning circuit 40, the analog-to-digital converter 43, and possibly the filter 46, the ODR modifier block 49 being provided on a separate die.

In general, in any case, for each sensor 5, 205, the detection unit 20, the analog conditioning circuit 40, and the analog-to-digital converter 43 may be considered functionally as forming a digital detector 48, which is represented by a dashed block in FIGS. 2, 3, and 11. In some applications, also the filter 46 may be considered as belonging to the digital detector 48.

According to an embodiment, the configuration block 58 of the reference sensor (of the first sensor 5A of the electronic apparatus 1 and of the first and second sensors 205A, 205B of the electronic apparatus 200) may be configured so that the respective external reference signal EXT_REF, REF1, REF2 has a frequency equal to a submultiple of order SM of the output sample rate $f_{ou}$ of the reference sensor. In other words, the external reference signal is generated every SM samples of the respective output signal $S_O$. Consequently, the configuration block 83 of the slave sensors (the second sensor 5B, 205B and the third sensor 5C, 205C) is configured so that the frequency-selection signal F_C indicates the number of frequency cycles Nf, measured by the respective measurement block 85, divided by the order SM of the frequency submultiple.

In practice, the digital output signal $S_O$ has a first frequency (output sample rate $f_{ou}$), and the reference or frequency-indication signal EXT_REF, REF1, REF2 has a second frequency, where the second frequency is a submultiple equal to the first frequency divided by an order of division SM, and where a first number of periods (number of frequency cycles Nf) is indicative of the number of periods of the clock signal CLK between two successive events of the frequency-indication signal, divided by the order of division SM.

Finally, all or part of the operations executed by the signal-conditioning stage 25 and by the configuration block 80, 83 may be obtained either using a hardware solution, via dedicated circuits, or using a software solution, via dedicated computer programs.

An integrated sensor (5A-5C; 205A-205C), the integrated sensor being configured to receive a frequency-indication signal (SU, EXT_REF; REF1, REF2) and to supply an output digital signal ($S_O$) including a plurality of samples, the integrated sensor may be summarized as including a digital detector (48), configured to detect a physical quantity and generate a discrete detection signal ($S_D$) indicative of the detected physical quantity; an output timing regulation block (80, 83), configured to receive the frequency-indication signal (SU, EXT_REF; REF1, REF2) and a set of local reference signals (CLK, INT_REF) and to generate a trigger signal (OUT_TRG) as a function of the frequency-indication signal and of the set of local reference signals; and an output stage (49), configured to receive the discrete detection signal and the trigger signal (OUT_TRG) and to supply the digital output signal ($S_O$) and a locking signal (EXT_REF, INT_REF; REF1, REF2), wherein the output stage (49) is configured to supply a sample of the discrete detection signal in response to the reception of the trigger signal, thereby generating the digital output signal, and to supply the locking signal in response to the reception of the trigger signal, the locking signal being temporally aligned with the digital output signal.

The digital detector (48) may include a detection unit (20) configured to detect the physical quantity and to generate an analog signal ($S_A$) indicative of the detected physical quantity, and an analog-to-digital conversion stage (40, 43, 46), configured to receive and discretize the analog signal ($S_A$) and to generate the discrete detection signal ($S_D$).

The integrated sensor may include a clock (30) configured to generate a clock signal (CLK) of a periodic type having a period; wherein the set of local reference signals may include the locking signal (INT_REF) and the clock signal; and the output timing regulation block (83) may include at least one counter (100, 120), configured to count the periods of the clock signal; a frequency-measurement circuit (105B, 105C, 110B), configured to count a first number of periods (NO of the clock signal (CLK) between two successive events of the frequency-indication signal and to generate an internal frequency signal (F_C) indicative of the first number of periods, the first number of periods measuring the frequency ($\Delta t$) of the frequency-indication signal (EXT_REF; REF1, REF2); a phase-measurement circuit (105A, 110A), configured to count a second number of periods (Nd) of the clock signal (CLK) between an event of the frequency-indication signal (EXT_REF; REF1, REF2) and an event of the locking signal (INT_REF) and to generate an internal phase signal (PH_C) indicative of the second number of periods, the second number of periods measuring a temporal shift (41) between the frequency-indication signal (EXT_REF; REF1, REF2) and the locking signal (INT_REF); and a comparison circuit (90, 120, 125), configured to generate the trigger signal (OUT_TRG) after a third number of periods of the clock signal (CLK), the third number of periods being a function of the first and the second number of periods.

The comparison circuit (90, 125) may include a respective counter (120) configured to store a count value (k) and to increment the count value by an increment at each period of the clock signal, the increment being a function of the second number of periods (Nd), the comparison circuit being configured to generate the trigger signal (OUT_TRG) if the count value is greater than or equal to the first number of periods (NO.

The comparison circuit (90) may be configured to perform a modulo operation between the count value (k) and the first number of periods, generate a modulo value and reset the count value (k) to the modulo value, if the count value is greater than or equal to the first number of periods.

The output stage (49) may include an interpolator (52) and a decimator (55), the interpolator being configured to upsample the discrete detection signal (SD), thus generating an interpolated signal (SD,int), the decimator being configured to downsample the interpolated signal in response to the reception of the trigger signal, thus generating the digital output signal.

The decimator (55) may include a filtering stage (65), a downsampling stage (68) and a gain stage (71); the filtering stage (65) including a low-pass filter having a respective cut-off frequency (fc) and being configured to receive the interpolated signal (SD,int) and to generate a filtered signal (F); the downsampling stage being configured to downsample the filtered signal in response to the reception of the trigger signal (OUT_TRG) and to generate a downsampled signal (DS) having a d.c. component; and the gain stage (71) being configured to amplify or attenuate the d.c. component of the 3 downsampled signal by a gain value (G).

The cut-off frequency of the filtering stage (65) and the gain value of the gain stage (71) may be a function of the frequency-indication signal (EXT_REF, F_C).

The integrated sensor may be a MEMS sensor.

The detection unit (20) may include a mechanical oscillator (37) subject to oscillations, and a sensing element (35), the mechanical oscillator being configured to be actuated at an operating frequency (fo) and to oscillate at an oscillation frequency depending upon the operating frequency and upon the physical quantity to be detected, and the sensing element being configured to convert the oscillations of the mechanical oscillator into the analog signal (SA).

An electronic apparatus may be summarized as including a plurality of integrated sensors, wherein the plurality of integrated sensors may include a reference sensor (5A; 205A, 205B) and a slave sensor (5B, 5C; 205B, 205C) mutually coupled, the reference sensor being configured to supply the respective locking signal (EXT_REF; REF1, REF2) to the slave sensor, wherein the frequency-indication signal of the slave sensor is the locking signal of the reference sensor.

The apparatus may include a control unit (7) coupled to the plurality of integrated sensors, the integrated sensors being configured to send, each, the respective digital output signal (SO) to the control unit.

The reference sensor may be configured to send the respective locking signal to the control unit, the control unit being configured to read the digital output signals received from the plurality of integrated sensors in response to the reception of the locking signal.

A method for synchronizing samples of digital output signals (SO) provided by a plurality of integrated sensors (5; 205) including a reference sensor (5A; 205A, 205B) and a slave sensor (5B, 5C; 205B, 205C), the integrated sensors of the plurality of integrated sensors each including an output timing regulation block (80, 83) and an output stage (49), wherein the output stage receives a discrete detection signal (SD) correlated to a detected physical quantity, may be summarized as including receiving, by the output timing regulation block (80) of the reference sensor, a first frequency-indication signal (SU) and a first set of local reference signals (CLK); supplying, by the output-regulation block (83) of the reference sensor, a first trigger signal (OUT_TRG) as a function of the first frequency-indication signal and of the first set of local reference signals (CLK); supplying, by the output stage of the reference sensor, a sample of the respective discrete detection signal in response to the reception of the first trigger signal (OUT_TRG), thus generating the respective digital output signal; supplying, by the output stage of the reference sensor, a first locking signal (EXT_REF) temporally aligned with the respective digital output signal, in response to the reception of the first trigger signal; receiving, by the output regulation block (83) of the slave sensor, the first locking signal; supplying, by the output-regulation block of the slave sensor, a second trigger signal (OUT_TRG) as a function of the first locking signal and of a second set of local reference signals (CLK, INT_REF); supplying, by the output stage (49) of the slave sensor, a sample of the respective discrete detection signal in response to the reception of the second trigger signal (OUT_TRG), thus generating the respective digital output signal; and supplying, by the output stage (49) of the slave sensor, a second locking signal (INT_REF; REF2) temporally aligned with the respective digital output signal, in response to the reception of the second trigger signal (OUT_TRG).

The output timing regulation block of the slave sensor, a second trigger signal may include counting periods of a clock signal (CLK) of the slave sensor; counting a first number of periods (NO of the clock signal (CLK) between two successive events of the first locking signal (EXT_REF; REF1, REF2); generating an internal frequency signal (F_C) indicative of the first number of periods, the first number of periods measuring the frequency (Δt) of the first locking signal (EXT_REF; REF1, REF2); counting a second number of periods (Nd) of the clock signal (CLK) between an event of the first locking signal (EXT_REF; REF1, REF2) and an event of the second locking signal (INT_REF); generating an internal phase signal (PH_C) indicative of the second number of periods, the second number of periods measuring a temporal shift (AA)) between the first locking signal (EXT_REF; REF1, REF2) and the second locking signal (INT_REF); and generating the second trigger signal (OUT_TRG) after a third number of periods of the clock signal (CLK), the third number of periods being a function of the first and the second number of periods.

The digital output signal of the reference sensor may have a first frequency (fou) and the first locking signal (EXT_REF; REF1, REF2) may have a second frequency, the second frequency being a submultiple of the first frequency equal to an order of division (SM), and counting a first number of periods of the clock signal may include dividing the first number of periods (Nf) by the order of division.

Generating the second trigger signal (OUT_TRG) after a third number of periods may include, by the output timing regulation block of the slave sensor storing a count value (k); increasing, at each period of the clock signal, the count value by an increment, the increment being a function of the second number of periods (Nd); verifying whether the count value is greater than or equal to the first number of periods (NO; and generating the second trigger signal (OUT_TRG) if the count value is greater than or equal to the first number of periods.

The method may include performing a modulo operation between the count value (k) and the first number of periods (NO, generating a modulo value and resetting the count value (k) to the modulo value, if the count value is greater than or equal to the first number of periods.

In an embodiment, a sensor includes detection circuitry and control circuitry coupled to the detection circuitry. The detection circuitry generates a detection signal indicative of a detected physical quantity. The control circuitry, in operation receives the detection signal and a frequency-indication signal, and generates a trigger signal based on the frequency-indication signal and a set of local reference signals. The sensor generates a digital output signal and a locking signal based on the trigger signal and the detection signal. The generating the digital output signal includes outputting a sample of the digital output signal based on the trigger signal. The locking signal is temporally aligned with the digital output signal. In an embodiment, the detection circuitry comprises: a detector, which, in operation, detects the physical quantity and generates an analog signal indicative of the detected physical quantity; and an analog-to-digital (A/D) converter coupled to the detector, which, in operation, generates the detection signal based on the analog signal indicative of the detected physical quantity. In an embodiment, the sensor comprises: a clock, which, in operation, generates a periodic clock signal, wherein, the set of local reference signals comprises the locking signal and the periodic clock signal, and the control circuitry, in operation: generates a frequency signal indicative of a frequency of the frequency-indication signal based on the periodic clock signal and the frequency-indication signal; generates a phase signal indicative of a phase-shift between the frequency-indication signal and the locking signal; and generates the trigger signal based on the generated frequency signal and the generated phase signal. In an embodiment, the control circuitry comprises: a counter, which, in operation, generates a count value based on the periodic clock signal and the generated phase signal; and a comparator, which, in operation, compares the count value to the generated frequency signal, generating the trigger signal. In an embodiment, the control circuitry, in operation, performs a modulo operation between the count value and the generated frequency signal, generating a modulo value; and resets the count value to the modulo value, in response to the count value being greater than or equal to the generated frequency signal. In an embodiment, the control circuitry comprises: an interpolator, which, in operation, upsamples the detection signal, generating an interpolated signal; and a decimator coupled to the interpolator, wherein the decimator, in operation, downsamples the interpolated signal based on the trigger signal, generating the digital output signal. In an embodiment, the decimator comprises: a low-pass filter, which, in operation, filters the interpolated signal, generating a filtered signal; a downsampler, which, in operation, downsamples the filtered signal, generating a downsampled signal; and a gain circuit, which, in operation, applies a gain to a direct current component of the downsampled signal, generating the digital output signal. In an embodiment, a cut-off frequency of the low-pass filter and the gain are based on the frequency-indication signal. In an embodiment, the sensor is a MEMS sensor. In an embodiment, the detector comprises: a mechanical oscillator, which, in operation, oscillates at an oscillating frequency based on the physical quantity being detected; and a sensing element coupled to the mechanical oscillator, wherein the sensing element, in operation, generates the analog signal based on the oscillating frequency of the mechanical oscillator.

In an embodiment, a system comprises: a plurality of sensors, each sensor including: detection circuitry, which, in operation, generates a detection signal indicative of a detected physical quantity; and processing circuitry coupled to the detection circuitry, wherein the processing circuitry, in operation: receives the detection signal; receives a frequency-indication signal; generates a trigger signal based on the frequency-indication signal and a set of local reference signals; generates a digital output signal and a locking signal based on the trigger signal and the detection signal, wherein the generating digital output signal comprises outputting a sample of the digital output signal based on the trigger signal and the locking signal is temporally aligned with the digital output signal, wherein, the plurality of sensors includes a reference sensor and a slave sensor coupled to the reference sensor; the locking signal of the reference sensor is the received frequency-indication signal of the slave sensor. In an embodiment, the system comprises: control circuitry coupled to the plurality of sensors, wherein the sensors, in operation, provide respective digital output signals to the control circuit. In an embodiment, the control circuitry, in operation: receives the locking signal of the reference sensor; and reads the digital output signals of the plurality of sensors in response to the reception of the locking signal of the reference sensor.

In an embodiment, a method comprises: synchronizing samples of digital output signals of a plurality of sensors, the plurality of sensors including a reference sensor and a slave sensor, the synchronizing including: receiving, by the reference sensor, a first frequency-indication signal; generating, by the reference sensor, a first trigger signal as a function of the first frequency-indication signal and a first set of local reference signals; generating, by the reference sensor based on the first trigger signal, a sample of the digital output signal of the reference sensor and a first locking signal, the first locking signal being temporally aligned with the digital output signal of the reference sensor; receiving, by the slave sensor, the first locking signal; generating, by the slave sensor, a second trigger signal as a function of the first locking signal and a second set of local reference signals; and generating, by the slave sensor based on the second trigger signal, a sample of the digital output signal of the slave sensor and a second locking signal, the second locking signal being temporally aligned with the digital output signal of the slave sensor. In an embodiment, the generating the second trigger signal comprises: counting periods of a clock signal of the slave sensor; counting a first number of periods of the clock signal between two successive events of the first locking signal; generating an internal frequency signal indicative of the first number of periods, the first number of periods being indicative of a frequency of the first locking signal; counting a second number of periods of the clock signal between an event of the first locking signal and an event of the second locking signal; generating an internal phase signal indicative of the second number of periods, the second number of periods being indicative of a temporal shift between the first locking signal and the second locking signal; and generating the second trigger signal after a third number of periods of the clock signal, the third number of periods being a function of the first number of periods and the second number of periods. In an embodiment, the digital output signal of the reference sensor has a first frequency and the first locking signal has a second frequency, the second frequency being a submultiple of the first frequency equal to an order of division, and wherein counting a first number of periods of the clock signal comprises dividing the first number of periods by the order of division. In an embodiment, the generating the second trigger signal after a third number of periods comprises, by the slave sensor: storing a count value; increasing, at each period of the clock signal, the count value by an increment, the increment being a function of the second number of periods; determining whether the count value is greater than or equal to the first number of periods; and generating the second trigger signal if the count value is greater than or equal to the first number of periods. In an embodiment, the method comprises performing a modulo operation between the count value and the first number of periods, generating a modulo value, and resetting the count value to the modulo value, if the count value is greater than or equal to the first number of periods.

In an embodiment a non-transitory computer-readable medium's contents configure processing circuitry to synchronize samples of digital output signals of a plurality of sensors, the plurality of sensors including a reference sensor and a slave sensor, the synchronizing including: receiving, by the reference sensor, a first frequency-indication signal; generating, by the reference sensor, a first trigger signal as a function of the first frequency-indication signal and a first set of local reference signals; generating, by the reference sensor based on the first trigger signal, a sample of the digital output signal of the reference sensor and a first locking signal, the first locking signal being temporally aligned with the digital output signal of the reference sensor; receiving, by the slave sensor, the first locking signal; generating, by the slave sensor, a second trigger signal as a function of the first locking signal and a second set of local reference signals; and generating, by the slave sensor based on the second trigger signal, a sample of the digital output signal of the slave sensor and a second locking signal, the second locking signal being temporally aligned with the digital output signal of the slave sensor. In an embodiment, the contents comprise instructions executed by the processing circuitry.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
digital signal processing circuitry, which, in operation, processes digital signals; and
a first sensor coupled to the digital signal processing circuitry, the first sensor comprising:
detection circuitry, which, in operation, generates a detection signal indicative of a detected physical quantity; and
control circuitry coupled to the detection circuitry, wherein the control circuitry, in operation:
receives the detection signal;
receives a frequency-indication signal;
generates a trigger signal based on the frequency-indication signal and a set of local reference signals; and
generates a digital output signal and a locking signal based on the trigger signal and the detection signal, wherein the generating of the digital output signal comprises outputting a sample of the digital output signal based on the trigger signal and the locking signal is temporally aligned with the digital output signal, wherein the detection circuitry comprises:
a detector, which, in operation, detects the physical quantity and generates an analog signal indicative of the detected physical quantity; and
an analog-to-digital (A/D) converter coupled to the detector, which, in operation, generates the detection signal based on the analog signal indicative of the detected physical quantity; and
the control circuitry comprises:
an interpolator, which, in operation, upsamples the detection signal, generating an interpolated signal; and
a decimator coupled to the interpolator, wherein the decimator, in operation, downsamples the interpolated signal based on the trigger signal, generating the digital output signal.

2. The system according to claim 1, wherein the decimator comprises:
a low-pass filter, which, in operation, filters the interpolated signal, generating a filtered signal;
a downsampler, which, in operation, downsamples the filtered signal, generating a downsampled signal; and
a gain circuit, which, in operation, applies a gain to a direct current component of the downsampled signal, generating the digital output signal.

3. The system according to claim 2, wherein a cut-off frequency of the low-pass filter and the gain are based on the frequency-indication signal.

4. The system according to claim 1, wherein the first sensor is a MEMS sensor.

5. The system according to claim 1, comprising:
a second sensor coupled to the digital signal processing circuitry and to the first sensor, wherein, in operation, the first sensor is a reference sensor and the second sensor is a slave sensor; and
the locking signal generated by the first sensor is provided to the second sensor as a frequency-indication signal.

6. The system according to claim 1, comprising:
a set of slave sensors coupled to the digital signal processing circuitry and to the first sensor, wherein, the digital signal processing circuitry, in operation:
receives the locking signal of the first sensor; and
reads digital output signals of the set of slave sensors in response to the reception of the locking signal of the first sensor.

7. A method, comprising:
generating an analog detection signal indicative of a detected physical quantity;
converting the analog detection signal to a digital detection signal indicative of the detected physical quantity;
generating a trigger signal based on a frequency-indication signal and a set of local reference signals;
generating an interpolated signal by upsampling the digital detection signal;
generating a digital output signal by decimating the interpolated signal;
generating a locking signal based on the trigger signal and the digital detection signal, wherein the generating of the digital output signal comprises outputting a sample of the digital output signal based on the trigger signal and the locking signal is temporally aligned with the digital output signal; and
synchronizing samples of digital output signals of a plurality of sensors based on the locking signal.

8. The method according to claim 7, wherein the decimating comprises:
  low-pass filtering the interpolated signal, generating a filtered signal;
  downsampling the filtered signal, generating a downsampled signal; and
  applying a gain to a direct current component of the downsampled signal, generating the digital output signal.

9. The method according to claim 8, wherein a cut-off frequency of the low-pass filtering and the gain are based on the frequency-indication signal.

10. The method according to claim 7, wherein the plurality of sensors comprises a reference sensor and a slave sensor, and the method comprises:
  generating the locking signal using the reference sensor; and
  providing the locking signal generated by the reference sensor to the slave sensor as a frequency-indication signal.

11. The method according to claim 7, wherein the plurality of sensors comprises a reference sensor and a set of slave sensors, and the method comprises:
  generating the locking signal using the reference sensor; and
  reading digital output signals of the set of slave sensors in response to reception of the locking signal of the reference sensor.

12. A non-transitory computer-readable medium having contents which configure a sensor system to synchronize samples of digital output signals of a plurality of sensors of the sensor system, the plurality of sensors including a reference sensor and a set of slave sensors, the synchronizing including:
  generating an analog detection signal indicative of a detected physical quantity;
  converting the analog detection signal to a digital detection signal indicative of the detected physical quantity;
  generating a trigger signal based on a frequency-indication signal and a set of local reference signals;
  generating an interpolated signal by upsampling the digital detection signal;
  generating a digital output signal by decimating the interpolated signal;
  generating a locking signal based on the trigger signal and the digital detection signal, wherein the generating of the digital output signal comprises outputting a sample of the digital output signal based on the trigger signal and the locking signal is temporally aligned with the digital output signal; and
  synchronizing samples of digital output signals of a plurality of sensors based on the locking signal.

13. The non-transitory computer-readable medium according to claim 12, wherein the decimating comprises:
  low-pass filtering the interpolated signal, generating a filtered signal;
  downsampling the filtered signal, generating a downsampled signal; and
  applying a gain to a direct current component of the downsampled signal, generating the digital output signal.

14. The non-transitory computer-readable medium according to claim 13, wherein a cut-off frequency of the low-pass filtering and the gain are based on the frequency-indication signal.

15. The non-transitory computer-readable medium according to claim 12, wherein the plurality of sensors comprises a reference sensor and a slave sensor, and the synchronizing comprises:
  generating the locking signal using the reference sensor; and
  providing the locking signal generated by the reference sensor to the slave sensor as a frequency-indication signal.

16. The non-transitory computer-readable medium of claim 12, wherein the contents comprise instructions, which, in operation, are executed by processing circuitry of the sensor system.

17. A sensing device, comprising:
  a first sensor of a set of sensors coupled together, wherein the first sensor, in operation:
    generates a first detection signal indicative of a first detected physical quantity;
    receives a first frequency-indication signal;
    generates a first trigger signal as a function of the first frequency-indication signal; and
    generates, based on the first trigger signal and the first detection signal, a first digital output signal and a first locking signal, the first locking signal being temporally aligned with the first digital output signal;
  a second sensor of the set of sensors, wherein the second sensor, in operation:
    generates a second detection signal indicative of a second detected physical quantity;
    receives the first locking signal from the first sensor;
    generates a second trigger signal as a function of the first locking signal; and
    generates, based on the second trigger signal and the second detection signal, a second digital output signal and a second locking signal, the second locking signal being temporally aligned with the second digital output signal; and
  a third sensor of the set of sensors, wherein the third sensor, in operation:
    generates a third detection signal indicative of a third detected physical quantity;
    receives the second locking signal from the second sensor;
    generates a third trigger signal as a function of the second locking signal; and
    generates, based on the third trigger signal and the third detection signal, a third digital output signal.

18. The sensing device of claim 17, comprising:
  digital signal processing circuitry coupled to the set of sensors, wherein the digital signal processing circuitry, in operation:
    receives the first locking signal and the first digital output signal from the first sensor; and
    processes the first digital output signal based on the first locking signal.

19. The sensing device of claim 18, wherein the digital signal processing circuitry, in operation:
  receives the second locking signal and the second digital output signal from the second sensor; and
  processes the second digital output signal based on the second locking signal.

20. The sensing device of claim 18, wherein the digital signal processing circuitry, in operation:
 selects a sensor of the set of sensors; and
 configures the selected sensor as the first sensor.

\* \* \* \* \*